US011728137B2

(12) United States Patent
Wang et al.

(10) Patent No.: US 11,728,137 B2
(45) Date of Patent: Aug. 15, 2023

(54) DIRECT FREQUENCY TUNING FOR MATCHLESS PLASMA SOURCE IN SUBSTRATE PROCESSING SYSTEMS

(71) Applicant: LAM RESEARCH CORPORATION, Fremont, CA (US)

(72) Inventors: Yuhou Wang, Fremont, CA (US); Maolin Long, Santa Clara, CA (US); Ying Wu, Livermore, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 131 days.

(21) Appl. No.: 17/267,920

(22) PCT Filed: Aug. 8, 2019

(86) PCT No.: PCT/US2019/045681
§ 371 (c)(1),
(2) Date: Feb. 11, 2021

(87) PCT Pub. No.: WO2020/036803
PCT Pub. Date: Feb. 20, 2020

(65) Prior Publication Data
US 2021/0210314 A1 Jul. 8, 2021

Related U.S. Application Data

(60) Provisional application No. 62/765,245, filed on Aug. 17, 2018.

(51) Int. Cl.
*H01J 37/32* (2006.01)

(52) U.S. Cl.
CPC .. *H01J 37/32165* (2013.01); *H01J 37/32183* (2013.01); *H01J 2237/24564* (2013.01); *H01J 2237/24585* (2013.01)

(58) Field of Classification Search
CPC ................ H01J 37/32; H01J 37/32082; H01J 37/32165; H01J 37/32174;
(Continued)

(56) References Cited

U.S. PATENT DOCUMENTS

| 2010/0171428 A1* | 7/2010 | Kirchmeier | ......... H02M 7/5383 315/111.21 |
| 2012/0000888 A1* | 1/2012 | Kawasaki | ................ H03H 7/38 333/17.3 |

(Continued)

OTHER PUBLICATIONS

International Search Report and Written Opinion of the ISA issued in PCT/US2019/045681, dated Nov. 28, 2019; ISA/KR.

*Primary Examiner* — Henry Luong
(74) *Attorney, Agent, or Firm* — Penilla IP, APC

(57) ABSTRACT

A drive circuit for providing RF power to a component of a substrate processing system includes a plasma source operating at a first frequency. A load includes the component of the substrate processing system. An impedance network connects the plasma source to the load. A current sensor senses current at an output of the plasma source. A voltage sensor senses voltage at the output of the plasma source. A controller includes a tuned frequency calculator configured to calculate a tuned frequency for the plasma source based on the voltage, the current, and a configuration of the impedance network and to adjust the first frequency based on the tuned frequency.

16 Claims, 9 Drawing Sheets

(58) Field of Classification Search
CPC .......... H01J 37/32183; H01J 37/32926; H01J 37/32935; H01J 2237/24564; H01J 2237/24585; H02M 3/337; H02M 3/538; H02M 7/4815; H03H 7/40; Y02B 70/10
See application file for complete search history.

(56) References Cited

U.S. PATENT DOCUMENTS

| | | |
|---|---|---|
| 2016/0111259 A1* | 4/2016 | Van Zyl .................. H05H 1/46 315/111.21 |
| 2017/0178864 A1 | 6/2017 | Valcore, Jr. et al. |
| 2017/0323771 A1 | 11/2017 | Choi et al. |
| 2017/0345618 A1 | 11/2017 | Schlierf |

* cited by examiner

DIRECT FREQUENCY TUNING FOR MATCHLESS PLASMA SOURCE IN SUBSTRATE PROCESSING SYSTEMS

CROSS-REFERENCE TO RELATED APPLICATIONS

This application is a U.S. National Phase Application under 35 U.S.C. 371 of International Application No. PCT/US2019/045681, filed on Aug. 8, 2019, which claims the benefit of U.S. Provisional Application No. 62/765,245, filed on Aug. 17, 2018. The entire disclosures of the applications referenced above are incorporated herein by reference.

FIELD

The present disclosure relates to substrate processing systems, and more particularly to direct frequency tuning for matchless plasma sources in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to etch thin film on substrates such as semiconductor wafers. Etching usually includes either wet chemical etching or dry etching. Dry etching may be performed using plasma generated by inductively-coupled plasma (ICP). The inductively-coupled plasma may be generated by coils arranged outside of a processing chamber adjacent to a dielectric window. Process gas flowing inside the processing chamber is ignited to create plasma. In some applications, RF plasma power is output to one or more inductive coils that are arranged outside of the processing chamber. RF bias power may also be supplied to an electrode in the substrate support to generate a capacitively coupled plasma (CCP).

The frequency of the ICP RF plasma power or CCP RF bias power can be varied to provide additional process control. In addition, a magnitude or level of the ICP RF plasma power or the CCP RF bias power can be varied during processing to provide additional process control. Changes in the ICP RF plasma power or level and/or the CCP RF bias power or level can cause changes in the impedance seen by the drive circuit. When an impedance mismatch occurs between the load and the drive circuit, power is reflected, which is inefficient.

SUMMARY

A drive circuit for providing RF power to a component of a substrate processing system includes a plasma source operating at a first frequency. A load includes the component of the substrate processing system. An impedance network connects the plasma source to the load. A current sensor senses current at an output of the plasma source. A voltage sensor senses voltage at the output of the plasma source. A controller includes a tuned frequency calculator configured to calculate a tuned frequency for the plasma source based on the voltage, the current, and a configuration of the impedance network, and to adjust the first frequency based on the tuned frequency.

In other features, the plasma source supplies RF plasma power to a coil of the substrate processing system. The plasma source supplies an RF bias to a substrate support of the substrate processing system. The plasma source comprises a matchless plasma source. The matchless plasma source includes a clock generator to generate a clock signal at the first frequency. A gate driver receives the clock signal. A half bridge circuit includes a first switch with a control terminal connected to the gate driver, a first terminal and a second terminal. A second switch includes a control terminal connected to the gate driver, a first terminal connected to the second terminal of the first switch and an output node, and a second terminal. A DC supply is connected to the half bridge circuit.

In other features, the DC supply includes a first DC supply to supply a first voltage potential to the first terminal of the first switch. A second DC supply supplies a second voltage potential to the second terminal of the second switch. The first voltage potential and the second voltage potential have opposite polarity and are approximately equal in magnitude.

In other features, the clock signal includes a square wave signal. The controller further includes a phase offset calculator to calculate a phase offset between the voltage and the current and a clock adjuster to adjust the first frequency based on the phase offset after adjusting the first frequency using the tuned frequency calculator.

In other features, the clock adjuster increases the first frequency when the current leads the voltage and decreases the first frequency when the voltage leads the current. The controller further includes a frequency adjuster to iteratively adjust the first frequency to increase a magnitude of the current after adjusting the first frequency using the tuning frequency calculator.

A method for providing RF power to a component of a substrate processing system includes arranging an impedance network between a plasma source and a load. The plasma source operates at a first frequency. The load includes the component of the substrate processing system. The method includes sensing current at an output of the plasma source; sensing voltage at the output of the plasma source; calculating a tuned frequency for the plasma source based on the voltage, the current, and a configuration of the impedance network; and adjusting the first frequency based on the tuned frequency.

In other features, the method include supplying RF plasma power to a coil of the substrate processing system. The method includes supplying an RF bias to a substrate support of the substrate processing system.

In other features, the plasma source comprises a matchless plasma source. The matchless plasma source includes a clock generator to generate a clock signal at the first frequency. A gate driver receives the clock signal. A half bridge circuit includes a first switch with a control terminal connected to the gate driver, a first terminal and a second terminal. A second switch includes a control terminal connected to the gate driver, a first terminal connected to the second terminal of the first switch and an output node, and a second terminal. A DC supply is connected to the half bridge circuit.

In other features, the DC supply includes a first DC supply to supply a first voltage potential to the first terminal of the first switch. A second DC supply supplies a second voltage potential to the second terminal of the second switch. The first voltage potential and the second voltage potential have opposite polarity and are approximately equal in magnitude.

In other features, the clock signal includes a square wave signal. The method includes calculating a phase offset between the voltage and the current; and adjusting the first frequency based on the phase offset after adjusting the first frequency based on the tuned frequency.

In other features, the method includes increasing the first frequency when the current leads the voltage and decreasing the first frequency when the voltage leads the current. The method includes iteratively adjusting the first frequency to increase a magnitude of the current after adjusting the first frequency.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In some applications, a frequency of the RF source power supplied to an ICP coil and/or an RF bias to an electrode in the substrate support is switched between two or more frequencies and/or two or more pulsing levels. An impedance of an RF generator is matched to a load (such as the inductive coils and the plasma or the electrode and the plasma). However, the impedance of the load changes as the plasma conditions vary, the pulsing level changes, and/or due to various other factors. When impedance mismatch occurs, power is reflected by the load, which is inefficient. Tuning of the circuits using variable capacitors is difficult due to the amount of time that is required to change the value of the capacitance relative to the switching period between frequency changes and/or level to level changes.

Systems and methods according to the present disclosure relate to a direct drive circuit including a frequency tuning circuit for generating RF power or RF bias. The direct drive circuits may be referred to herein as a matchless plasma source (MPS) such as a matchless inductively coupled plasma source or a matchless capacitively coupled plasma source. The direct drive circuit according to the present disclosure operates at low impedance, which eliminates the matching problems described above.

Figure 1C:
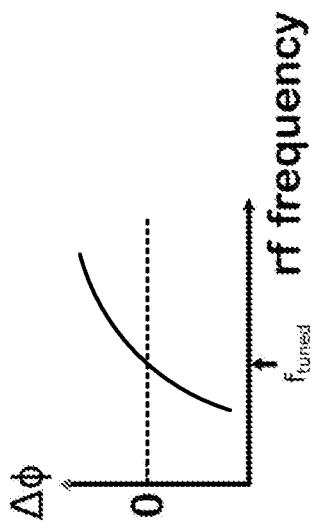
FIG. 1C is a graph illustrating an example of tuning of the RF frequency using the phase offset.
Figure 1B:
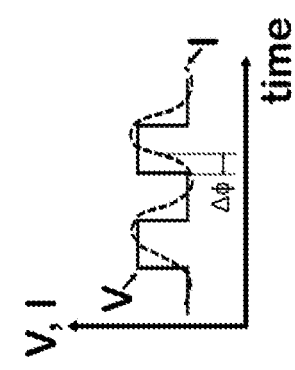
FIG. 1B is a graph illustrating tuning of a matchless plasma source to the plasma load based on phase offset between current and voltage.
Figure 2:
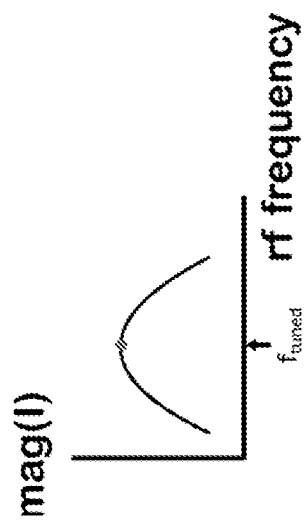
FIG. 2 is a graph illustrating an example of tuning of the RF frequency based on the magnitude of the current.
Figure 1A:
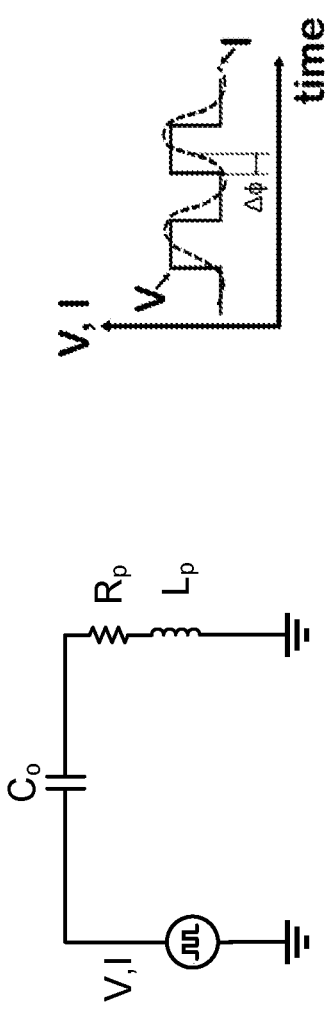
FIG. 1A is a simplified electrical schematic of a matchless plasma source and a plasma load.

While the following description refers to matchless ICP plasma sources, the discussion also applies to other MPS such as matchless CCP bias sources for the RF bias to the substrate support. Referring now to FIGS. 1A to 2, there are several different methods for frequency tuning for matchless plasma sources. In FIGS. 1A to 1C, the phase difference is measured between the voltage and current, and a controller such as a proportional, integral, derivative (PID) controller is used to tune the RF frequency to adjust the phase difference to 0 as can be seen in FIGS. 1B and 1C. In FIG. 1A, the MPS source outputs a square wave RF voltage to a plasma load. In this case, the load includes an inductive plasma load ($R_p$ and $L_p$) and an external capacitor ($C_0$). The RF voltage and current waveforms are monitored at the output of the MPS source. In FIG. 1B, the phase angle difference between the current and voltage is calculated by a controller. In FIG. 1C, the phase angle difference is a function of the RF frequency. When tuned, the phase angle difference=0, i.e. the load appears to be completely resistive.

In FIG. 2, another method measures the RF current and then tunes the RF frequency to search for the maximum current. The magnitude of current as measured in FIG. 1A is a function of the RF frequency. When tuned, the magnitude of the current reaches a maximum value.

The main drawback of the two existing methods is the slow tuning speed since both phase offset and peak-searching approaches are iterative in nature. The present disclosure relates to systems and methods for tuning the frequency of the MPS source to eliminate mismatch. The systems and methods for tuning the MPS source consider the full circuit and directly calculate the tuned frequency without iterations. In some examples, the MPS source outputs the RF signal at the tuned frequency without determining the phase offset iteratively or searching for a maximum current value. In other examples, the phase offset or current magnitude are used after initial tuning using the approach described below.

Figure 3:
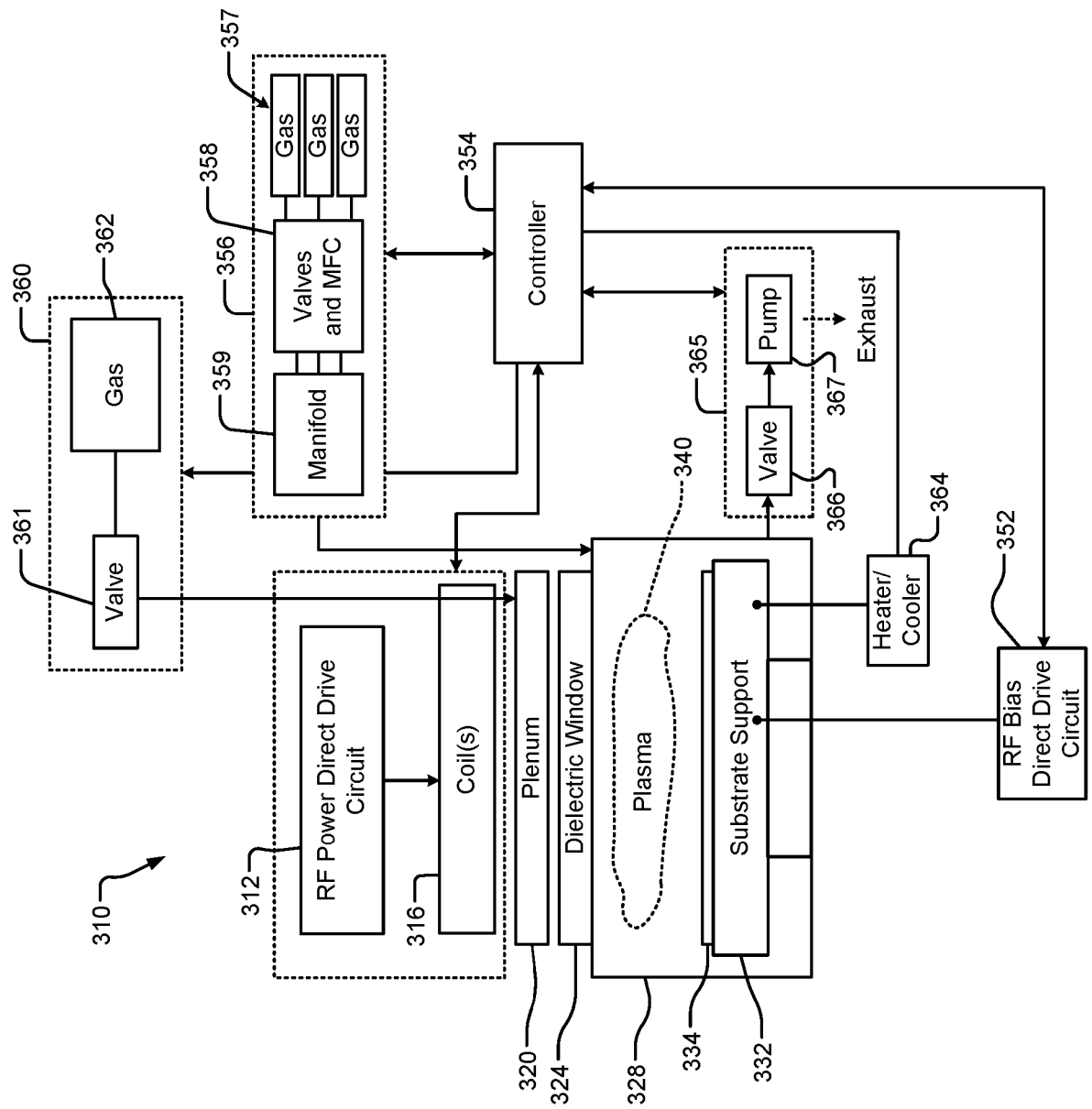
FIG. 3 is a functional block diagram of an example of a substrate processing system.

Referring now to FIG. 3, an example of a substrate processing system 310 according to the present disclosure is shown. The substrate processing system 310 includes an RF power direct drive circuit 312. In some examples, the RF power can be pulsed on and off and/or an amplitude or level of the RF power can be varied.

In some examples, a plenum 320 may be arranged between the coils 316 and a dielectric window 324 to control the temperature of the dielectric window 324 with hot and/or cold air flow. The dielectric window 324 is arranged along one side of a processing chamber 328. The processing chamber 328 further comprises a substrate support (or pedestal) 332. The substrate support 332 may include an electrostatic chuck (ESC), or a mechanical chuck or other type of chuck to support a substrate 334. Process gas is supplied to the processing chamber 328 and plasma 340 is generated inside of the processing chamber 328. The plasma 340 etches an exposed surface of the substrate 334. An RF bias direct drive circuit 352 (such as one of those described below) may be used to provide an RF bias to an electrode in the substrate support 332 during operation.

A gas delivery system 356 may be used to supply a process gas mixture to the processing chamber 328. The gas delivery system 356 may include process and inert gas sources 357, a gas metering system 358 (such as valves and mass flow controllers), and a manifold 359. A gas delivery system 360 may be used to deliver gas from a gas source 362 via a valve 361 to the plenum 320. The gas may include cooling gas (such as air or an inert gas) that is used to cool the coils 316 and the dielectric window 324. A heater/cooler 364 may be used to heat/cool the substrate support 332 to a predetermined temperature. An exhaust system 365 includes a valve 366 and pump 367 to remove reactants from the processing chamber 328 by purging or evacuation.

A controller 354 may be used to control the etching process. The controller 354 monitors system parameters and controls delivery of the gas mixture, striking, maintaining and extinguishing the plasma, removal of reactants, supply of cooling gas, and so on. Additionally, as described below in detail, the controller 354 may control various aspects of the RF power direct drive circuit 312 and the RF bias direct drive circuit 352.

Figure 4A:
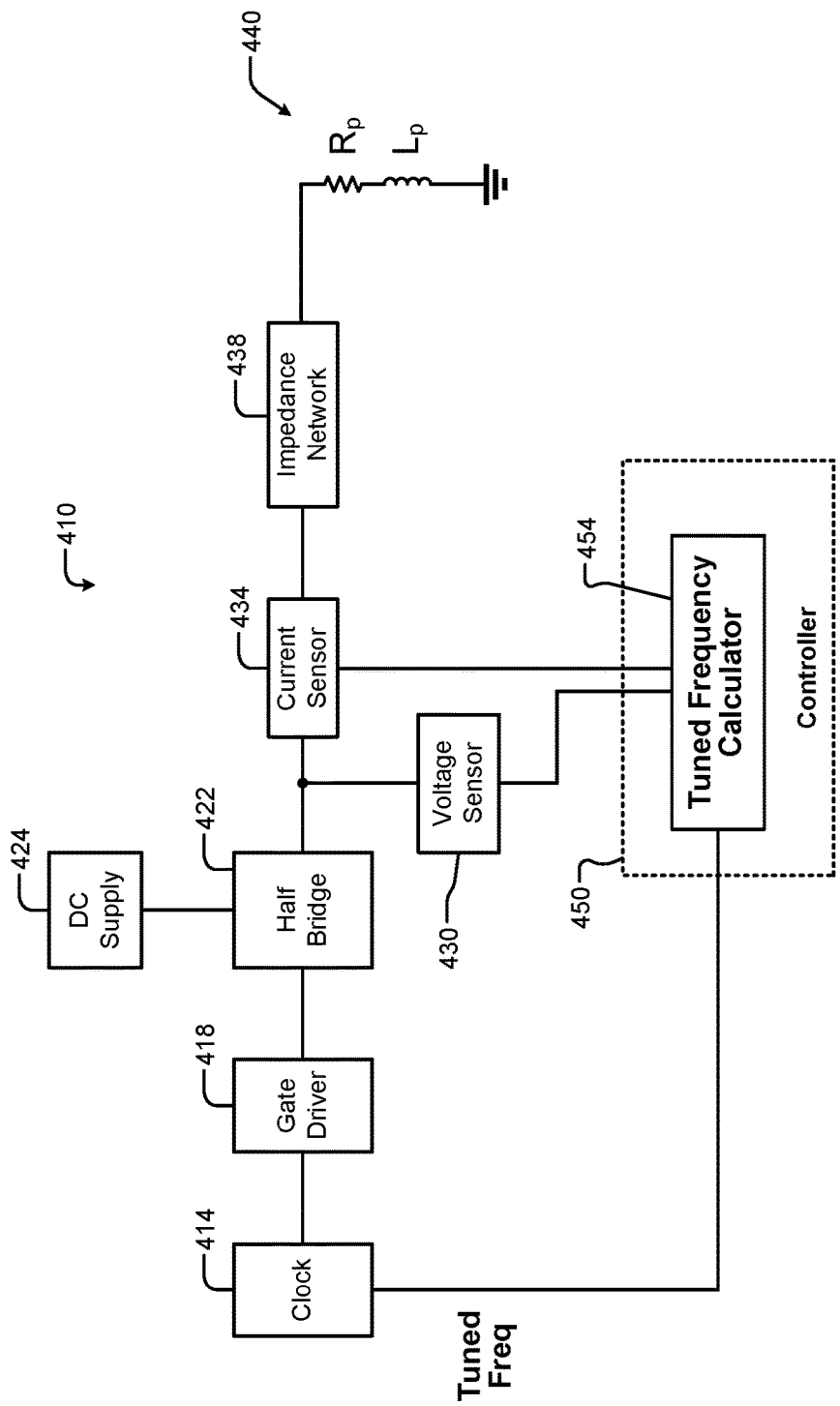
FIG. 4A to 4C are functional block diagrams of examples of drive circuits including a tuned frequency calculator according to the present disclosure.
Figure 4B:
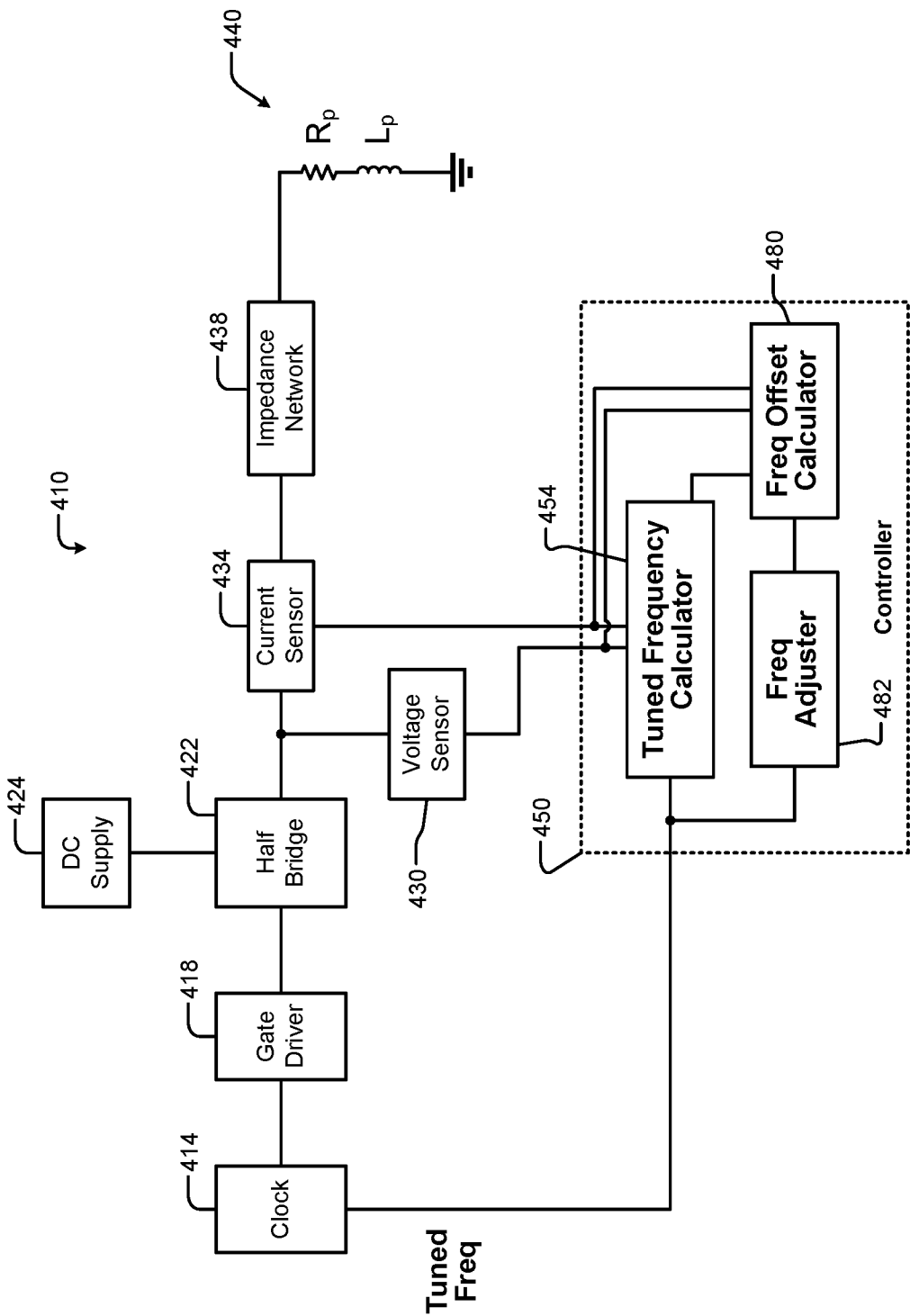
Figure 4C:
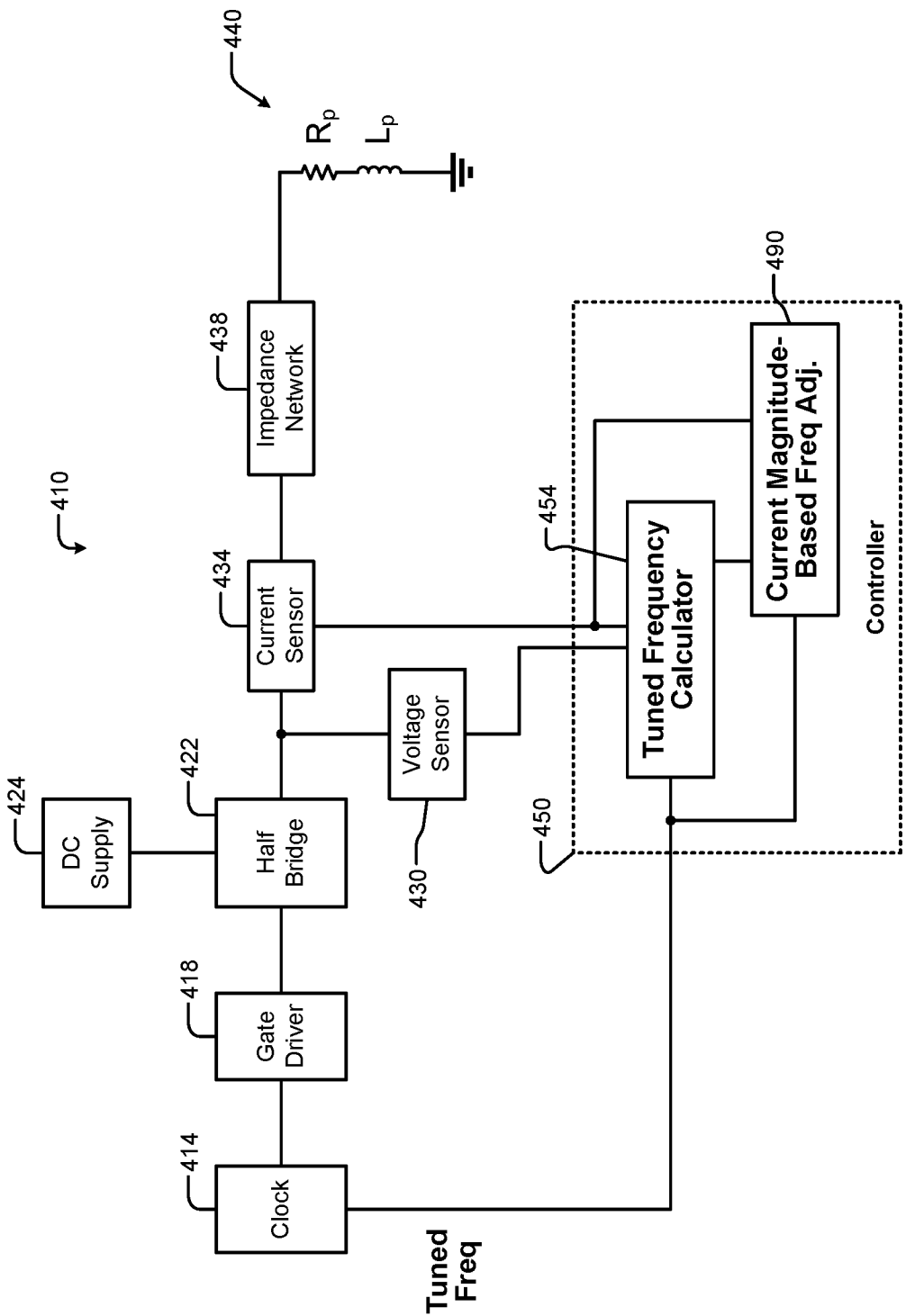

Referring now to FIGS. 4A to 4C, the frequency tuning circuit can be used alone or in combination with the tuning performed based on the phase offset and/or the magnitude of the current. In FIG. 4A, an MPS source 410 includes a clock generator 414 that generates a square wave clock signal having a variable frequency. An output of the clock generator 414 is input to a gate driver 418. An output of the gate driver 418 drives a half bridge 422, which is connected to a DC supply 424. A voltage sensor 430 senses a voltage at the output of the half bridge 422. A current sensor 434 senses current flowing at the output of the half bridge 422. An impedance network 438 connects the output of the half bridge 422 to a load 440 such as a plasma load.

The MPS source 410 further includes a controller 450 including a tuned frequency calculator 454 configured to calculate a tuned frequency for the clock 414 as described further below. The MPS source 410 drives a load 440 (such as an inductive plasma load $R_p$ and $L_p$ or a capacitive plasma load $R_p$ and $C_p$) through an impedance network 438 including one or more impedances such as one or more interconnected capacitances and/or inductances. In some examples, the impedance network 438 can include an auxiliary neutralizing capacitor $C_0$. At any moment of operation (tuned or not), the controller 450 has information about current, voltage and RF frequency, and configuration and values of the impedance network 438. Using the information, a tuned frequency calculator 454 in the controller 450 can calculate $L_p$ or $C_p$ and calculate the RF frequency $\omega_t$ needed to make the whole load entirely resistive.

In some examples, the approach described above can be combined with the other methods described in FIGS. 1A to 2. In FIG. 4B, a phase offset calculator 480 also calculates a phase offset between the voltage and current. A frequency adjuster 482 is selectively enabled to adjust the frequency of the clock based on the offset after initial tuning is performed by the tuned frequency calculator 454. Tuning using the frequency tuning calculator 454 can be performed once, for a period or until an event occurs and then tuning using the frequency offset can be performed thereafter.

In FIG. 4C, a current magnitude-based frequency calculator 490 is selectively enabled to adjust the frequency of the clock based on the current magnitude after initial tuning is performed by the tuned frequency calculator 454. Tuning using the frequency tuning calculator 454 can be performed once, for a period or until an event occurs and then tuning using the current magnitude can be performed thereafter.

Figure 5A:
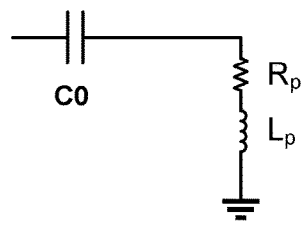
FIGS. 5A to 5D are electrical schematics illustrating examples of impedance networks arranged between the drive circuit and the plasma load.
Figure 5B:
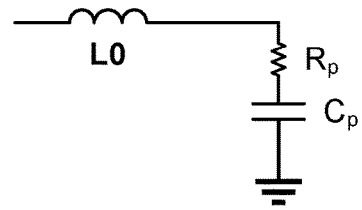
Figure 5C:
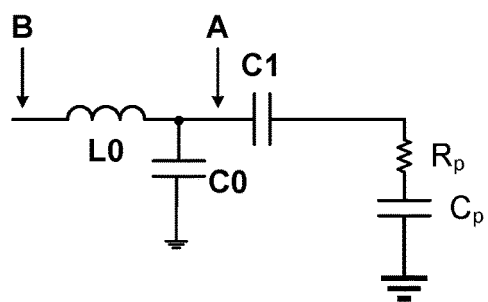
Figure 5D:
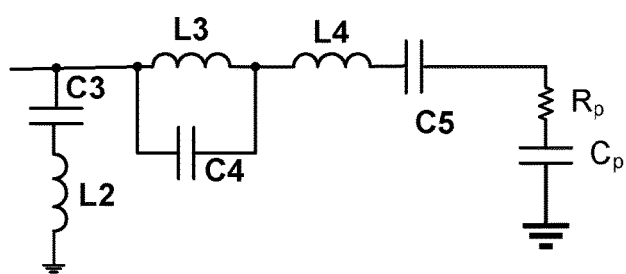

Referring now to FIGS. 5A to 5D, non-limiting examples of impedance networks are shown. As can be appreciated, the impedance network can include any combination of interconnected inductances and/or capacitances. In FIG. 5A, the impedance network 438 includes a capacitance $C_0$. In FIG. 5B, the impedance network 538 includes an inductance $L_0$. In FIG. 5C, the impedance network 438 includes series connected inductance $L_0$ and capacitance $C_1$ and a parallel capacitance $C_0$. In FIG. 5D, the impedance network includes impedances $L_3$ and $L_4$ connected in series, a capacitance $C_4$ connected in parallel to terminals of the inductance $L_3$, a capacitance $C_3$ and an inductance $L_2$ are connected in series and in parallel to one terminal of the inductance $L_3$, and a capacitance $C_5$ connected in series with one terminal of the inductance $L_4$.

Systems and methods described herein can also be used for coarse tuning when the system is outside of a predetermined range from the tuned condition. Phase offset or peak-searching can be used inside of the predetermined range from the tuned condition.

Figures 6, 7:
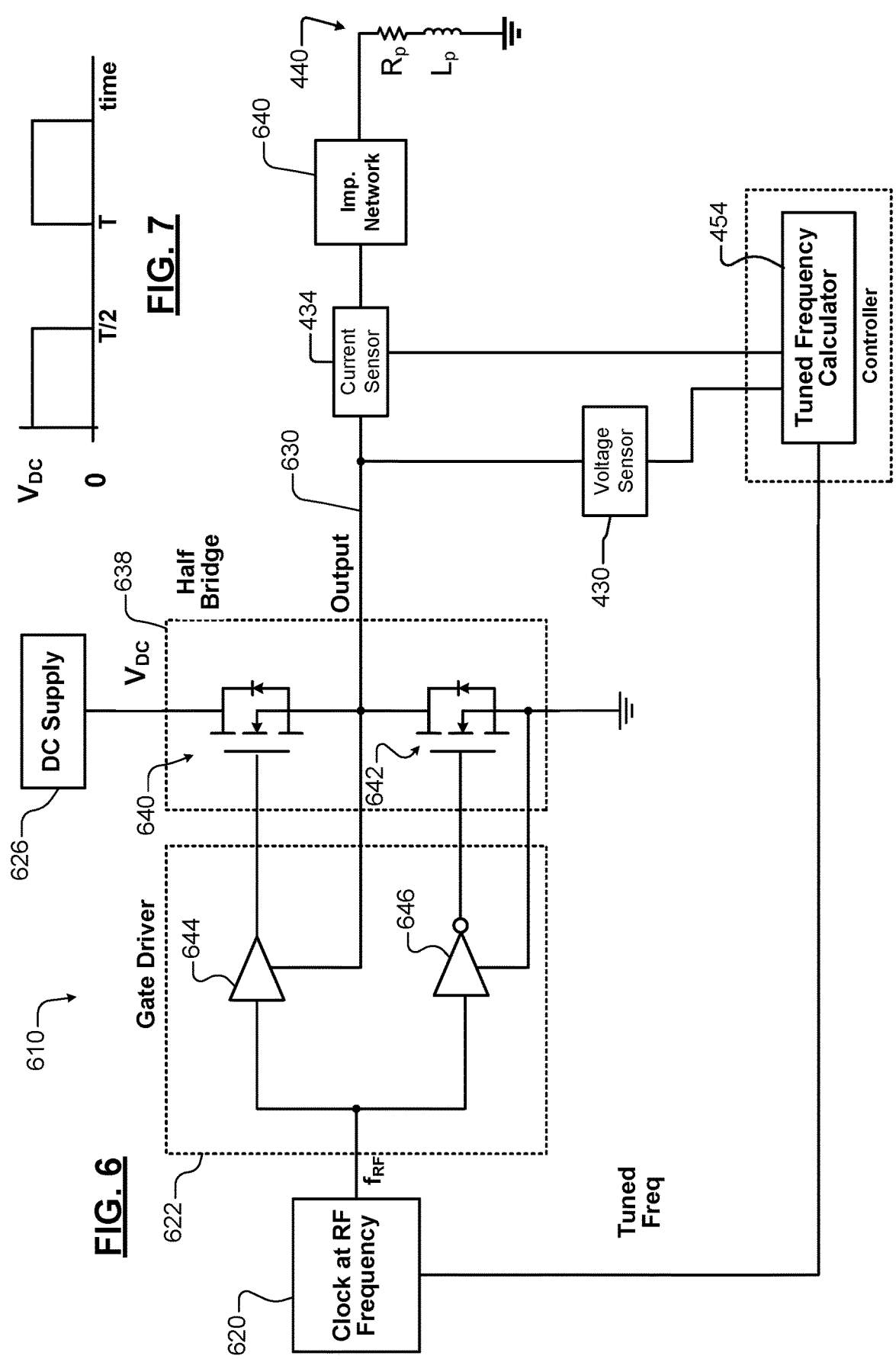
FIG. 6 is a functional block diagram of a more detailed example of a direct drive circuit according to the present disclosure.
FIG. 7 is a graph illustrating operation of the DC supply.

Referring now to FIGS. 6 and 7, a drive circuit 610 for supplying the RF bias (or the RF plasma power) is shown. The drive circuit 610 includes a clock 620 that operates at one or more selected RF frequencies. The clock signal that is output by the clock 620 is input to a gate driver circuit 622. In some examples, the gate driver circuit 622 includes an amplifier 644 and an inverting amplifier 646 having respective inputs connected to the clock 620.

Outputs of the gate driver circuit 622 are input to a half bridge circuit 638. In some examples, the half bridge circuit 638 includes a first switch 640 and a second switch 642. In some examples, the first switch 640 and the second switch 642 include metal oxide semiconductor field effect transistors (MOSFETs). The first switch 640 and the second switch 642 each include a control terminal, and first and second terminals. An output of the amplifier 644 of the gate driver circuit 622 is input to the control terminal of the first switch 640. An output of the inverting amplifier 646 of the gate driver circuit 622 is input to the control terminal of the second switch 642.

An output node 630 is connected to the second terminal of the first switch 640 and to the first terminal of the second switch 642. The first terminal of the first switch 640 is connected to the DC supply 626. The second terminal of the second switch 642 is connected to a reference potential such as ground. The output node 630 is connected by an impedance network 640 to the load 440. In some examples, an inductance $L_p$ in series with a resistance $R_p$ may be used to model the impedance seen by the drive circuit 610 (e.g. plasma inductance and resistance, the inductance and resistance of the coil, and/or other stray or parasitic inductance and resistance). In FIG. 7, an example of the DC supply signal is shown.

Figure 9:
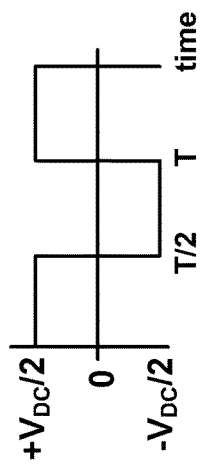
FIG. 9 is a graph illustrating operation of the DC supplies.
Figure 8:
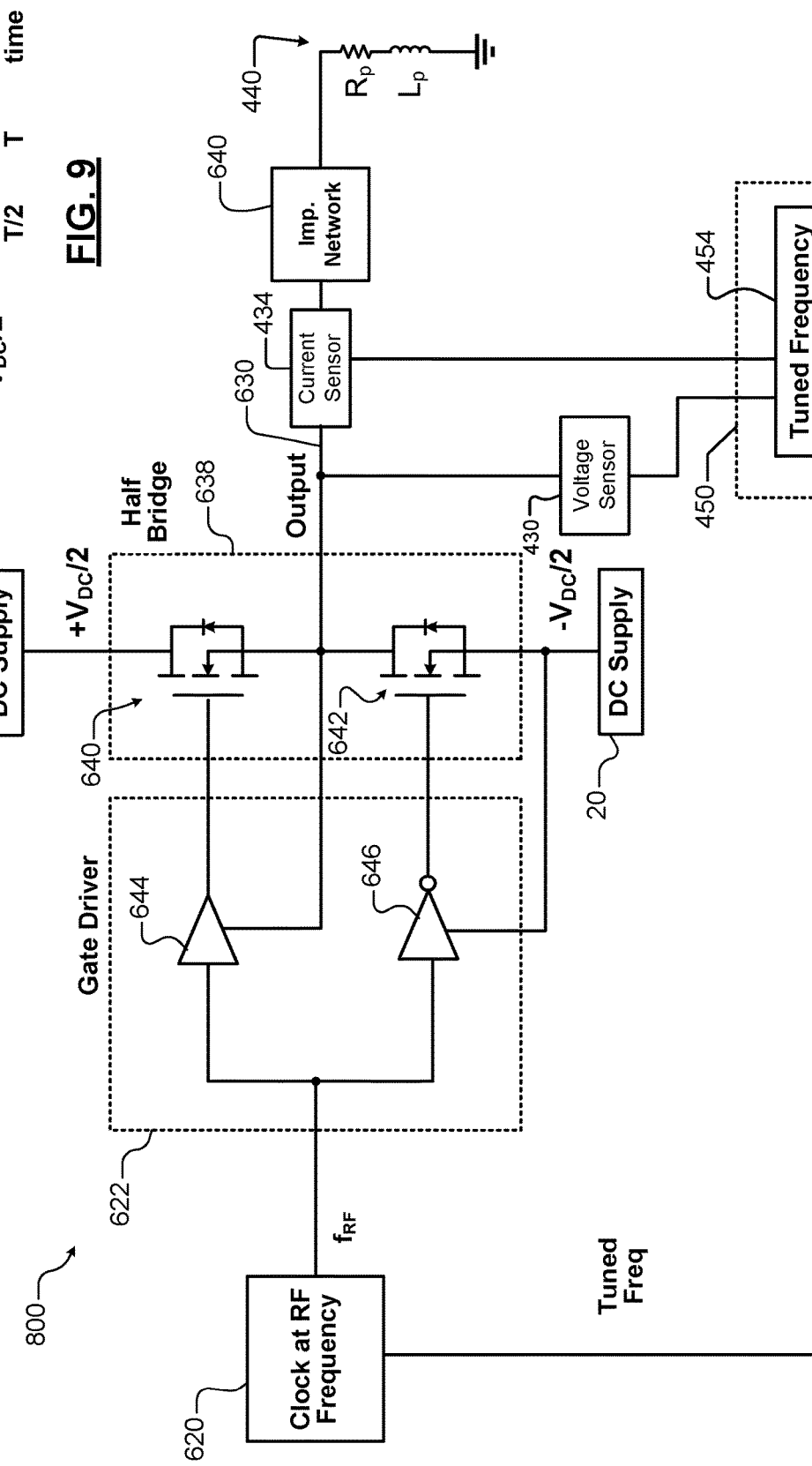
FIG. 8 is a functional block diagram of another detailed example of a direct drive circuit according to the present disclosure.

Referring now to FIGS. 8 and 9, dual DC supplies can be used to remove DC offset. A drive circuit 800 includes a first DC supply 810 operating at $+V_{DC}/2$ and a second DC supply 820 operating at $-V_{DC}/2$. To achieve the same output RF power, both the first and second DC supplies 810, 820 operate at half the voltage of the single DC supply in FIG. 6. In some examples, the first DC supply 810 and the second DC supply 820 operate at approximately the same magnitude and opposite polarity. As used herein, approximately the same refers to a difference between a magnitude of the DC voltage output by the first DC supply 810 relative to the second DC supply 820 that is less than 10%, 5% or 1%. The first DC supply 810 is connected to the first terminal of the first switch 640. The second DC supply 820 is connected to the second terminal of the second switch 642. In FIG. 9, an example of the DC supply signal is shown.

Figure 10:
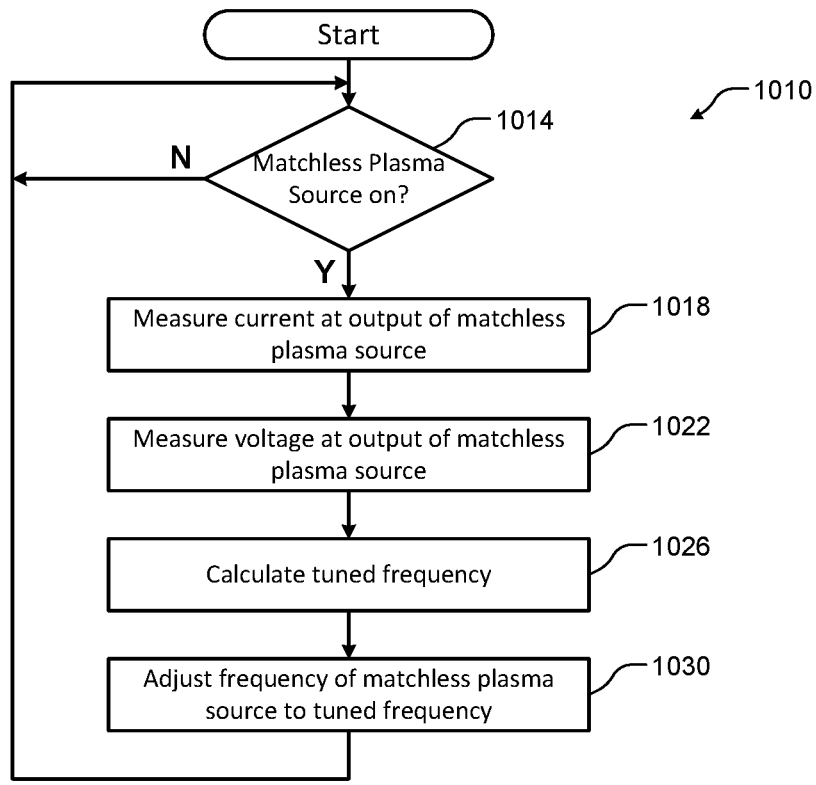
FIG. 10 is a flowchart illustrating an example of a method for calculating a tuned frequency for the matchless plasma source.

In FIG. 10, a method 1010 for calculating the tuned frequency and adjusting the frequency of the MPS based the calculated tuned frequency is shown. At 1014, the method determines whether the MPS is on. If 1014 is true, the method continues at 1018 and measures the current at the output of the MPS. At 1022, the method measures the voltage at the output of the MPS. At 1026, the method calculates the tuned frequency for the MPS based on the tuned frequency, the configuration of the impedance network and the load and returns to 1014.

Several examples for calculating the tuned frequency are provided below. In the examples shown in FIG. 5A, the tuned frequency of the MPS can be calculated as follows:

$$\frac{V}{I} = \frac{1}{j\omega C_0} + R_p + j\omega L_p \tag{1}$$

$$\operatorname{Re}\left(\frac{V}{I}\right) = R_p \tag{2}$$

$$\operatorname{Im}\left(\frac{V}{I}\right) = -\frac{1}{\omega C_0} + \omega L_p \tag{3}$$

From (1), the unknown load is:

$$L_p = \left(\operatorname{Im}\left(\frac{V}{I}\right) + \frac{1}{\omega C_0}\right)/\omega \tag{4}$$

From (4), tuned frequency is $$\omega_t = \frac{1}{\sqrt{L_p C_0}} \tag{5}$$

All of the values on the right hand side of equation (4) are known and so $L_p$ can be calculated. Therefore, the tuned frequency can be calculated since $C_0$ is known.

In the examples shown in FIG. 5B, the tuned frequency of the MPS can be calculated as follows:

$$\frac{V}{I} = j\omega L_0 + R_p + \frac{1}{j\omega C_p} \tag{6}$$

$$\operatorname{Re}\left(\frac{V}{I}\right) = R_p \tag{7}$$

$$\operatorname{Im}\left(\frac{V}{I}\right) = \omega L_0 - \frac{1}{\omega C_p} \tag{8}$$

From (6), the unknown load is:

$$C_p = \left(\operatorname{Im}\left(\frac{V}{I}\right) + \omega L_0\right)/\omega. \tag{9}$$

From (9), the tuned frequency is:

$$\omega_t = \frac{1}{\sqrt{L_0 C_p}} \tag{10}$$

All of the values on the right hand side of equation (9) are known and so $C_p$ can be calculated. Therefore, the tuned frequency can be calculated since $L_0$ is known.

In the example shown in FIG. 5C, the voltage and current at point A is equal to:

$$V_0 = V - Ij\omega L_0 \tag{11}$$

$$I_0 = I - \frac{V_0}{\frac{1}{j\omega C_0}} \tag{12}$$

$$\frac{V_0}{I_0} = \frac{1}{j\omega C_1} + R_p + \frac{1}{j\omega C_p} \tag{13}$$

$$\operatorname{Re}\left(\frac{V_0}{I_0}\right) = R_p \tag{14}$$

$$\operatorname{Im}\left(\frac{V_0}{I_0}\right) = -\frac{1}{\omega C_1} - \frac{1}{\omega C_p} \tag{15}$$

From (15), the unknown load $$C_p = \frac{-1}{\omega\left(\operatorname{Im}\left(\frac{V_0}{I_0}\right) + \frac{1}{\omega c_1}\right)}. \tag{16}$$

For $Rp \ll 1/\omega C_p$, the tuned frequency is:

$$\omega_t = \frac{1}{\sqrt{L_0\left(C_0 + \frac{1}{\left(\frac{1}{C_1} \mp \frac{1}{C_p}\right)}\right)}}$$

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The invention claimed is:
1. A drive circuit for providing RF power to a component of a substrate processing system, comprising:
   a plasma source operating at a first frequency;
   an impedance network;
   a load including the component of the substrate processing system, wherein the impedance network connects the plasma source to the load;
   a current sensor to sense current at an output of the plasma source;
   a voltage sensor to sense voltage at the output of the plasma source; and
   a controller including a tuned frequency calculator configured to:
      calculate a tuned frequency for the plasma source based on the voltage, the current and a configuration of the impedance network; and
      adjust the first frequency based on the tuned frequency;
   wherein the plasma source comprises a matchless plasma source that includes,
      a clock generator to generate a clock signal at the first frequency;
      a gate driver to receive the clock signal;
      a half bridge circuit including:
      a first switch with a control terminal connected to the gate driver, a first terminal and a second terminal;
      a second switch with a control terminal connected to the gate driver, a first terminal connected to the second terminal of the first switch and an output node, and a second terminal; and
      a DC supply connected to the half bridge circuit.

2. The drive circuit of claim 1, wherein the plasma source supplies RF plasma power to a coil of the substrate processing system.

3. The drive circuit of claim 1, wherein the plasma source supplies an RF bias to a substrate support of the substrate processing system.

4. The drive circuit of claim 1, wherein the DC supply includes:
a first DC supply to supply a first voltage potential to the first terminal of the first switch; and
a second DC supply to supply a second voltage potential to the second terminal of the second switch, wherein the first voltage potential and the second voltage potential have opposite polarity and are approximately equal in magnitude.

5. The drive circuit of claim 1, wherein the clock signal includes a square wave signal.

6. The drive circuit of claim 1, wherein the controller further includes:
a phase offset calculator to calculate a phase offset between the voltage and the current: and
a clock adjuster to adjust the first frequency based on the phase offset after adjusting the first frequency using the tuned frequency calculator.

7. The drive circuit of claim 6, wherein the clock adjuster increases the first frequency when the current leads the voltage and decreases the first frequency when the voltage leads the current.

8. The drive circuit of claim 1, wherein the controller further includes a frequency adjuster to iteratively adjust the first frequency to increase a magnitude of the current after adjusting the first frequency using the tuning frequency calculator.

9. A method for providing RF power to a component of a substrate processing system, comprising:
arranging an impedance network between a plasma source and a load, wherein the plasma source operates at a first frequency, and the load includes the component of the substrate processing system;
sensing current at an output of the plasma source;
sensing voltage at the output of the plasma source;
calculating a tuned frequency for the plasma source based on the voltage, the current: and a configuration of the impedance network; and
adjusting the first frequency based on the tuned frequency;

wherein the plasma source comprises a matchless plasma source that includes,
a clock generator to generate a clock signal at the first frequency;
a gate driver to receive the clock signal;
a half bridge circuit including:
a first switch with a control terminal connected to the gate driver, a first terminal and a second terminal;
a second switch with a control terminal connected to the gate driver, a first terminal connected to the second terminal of the first switch and an output node, and a second terminal; and
a DC supply connected to the half bridge circuit.

10. The method of claim 9, further comprising supplying RF plasma power to a coil of the substrate processing system.

11. The method of claim 9, further comprising supplying an RF bias to a substrate support of the substrate processing system.

12. The method of claim 9, wherein the DC supply includes:
a first DC supply to supply a first voltage potential to the first terminal of the first switch; and
a second DC supply to supply a second voltage potential! to the second terminal of the second switch, wherein the first voltage potential and the second voltage potential have opposite polarity and are approximately equal in magnitude.

13. The method of claim 9, wherein the clock signal includes a square wave signal.

14. The method of claim 9, further comprising:
calculating a phase offset between the voltage and the current; and
adjusting the first frequency based on the phase offset after adjusting the first frequency based on the tuned frequency.

15. The method of claim 14, further comprising increasing the first frequency when the current leads the voltage and decreasing the first frequency when the voltage leads the current.

16. The method of claim 9, further comprising iteratively adjusting the first frequency to increase a magnitude of the current after adjusting the first frequency.

* * * * *